(12) United States Patent
Djogo et al.

(10) Patent No.: US 11,879,927 B2
(45) Date of Patent: Jan. 23, 2024

(54) TRIGGERED VACUUM GAP FAULT DETECTION METHODS AND DEVICES

(71) Applicant: S&C Electric Company, Chicago, IL (US)

(72) Inventors: Goran Djogo, Mt. Prospect, IL (US); Michael Ennis, Evanston, IL (US)

(73) Assignee: S&C Electric Company, Chicago, IL (US)

( * ) Notice: Subject to any disclaimer, the term of this patent is extended or adjusted under 35 U.S.C. 154(b) by 48 days.

(21) Appl. No.: 16/717,709

(22) Filed: Dec. 17, 2019

(65) Prior Publication Data

US 2020/0191855 A1    Jun. 18, 2020

Related U.S. Application Data

(60) Provisional application No. 62/781,389, filed on Dec. 18, 2018.

(51) Int. Cl.
  *G01R 31/08* (2020.01)
  *G01R 31/327* (2006.01)

(52) U.S. Cl.
  CPC ....... *G01R 31/086* (2013.01); *G01R 31/3274* (2013.01)

(58) Field of Classification Search
  None
  See application file for complete search history.

(56) References Cited

U.S. PATENT DOCUMENTS

| | | | |
|---|---|---|---|
| 3,323,002 A | 5/1967 | Lafferty | |
| 3,489,873 A | 1/1970 | Kurtz et al. | |
| 3,811,070 A | 5/1974 | Voshall | |
| 4,126,808 A | 11/1978 | Rich | |
| 4,978,893 A | 12/1990 | Brannon et al. | |
| 8,279,567 B2 | 10/2012 | Bengtsson et al. | |
| 8,861,155 B2 | 10/2014 | Rostron | |

(Continued)

FOREIGN PATENT DOCUMENTS

| | | |
|---|---|---|
| CN | 103311808 A | 9/2013 |
| CN | 203942505 U | 11/2014 |
| JP | H01186780 A | 7/1989 |

OTHER PUBLICATIONS

Parashar Rama Shanker; Generator Power Switching Apparatus; Date Published Nov. 25, 2015; EP 2947675 A1; (Year: 2015).*

(Continued)

*Primary Examiner* — Nasima Monsur

(57) ABSTRACT

A system and method for determining if a fault condition exists in an electrical network. The method includes determining that a fault protection device has been opened and monitoring a voltage angle of a voltage waveform across a vacuum gap switching arrangement if the fault protection device is open, where the vacuum gap switching arrangement includes at least one vacuum gap switching element. The method also includes triggering a breakdown of a vacuum gap in the at least one vacuum gap switching element when the voltage angle corresponds to a predetermined switching angle to enable a temporary current flow through the vacuum gap switching arrangement, measuring the current flow through the vacuum gap switching arrangement, and determining whether the fault condition exists based at least in part on the measured current flow.

17 Claims, 5 Drawing Sheets

(56) References Cited

U.S. PATENT DOCUMENTS

| | | | | |
|---|---|---|---|---|
| 9,134,379 B2* | 9/2015 | Lang | ............................ | B60L 9/00 |
| 2008/0061632 A1* | 3/2008 | Couture | ............... | H01H 33/666 |
| | | | | 307/125 |
| 2011/0215717 A1* | 9/2011 | Chen | ......................... | H01J 1/34 |
| | | | | 313/542 |
| 2013/0301180 A1* | 11/2013 | Crane | .................... | H01H 33/66 |
| | | | | 361/115 |
| 2013/0335861 A1* | 12/2013 | Laschinski | ........... | H02H 1/0015 |
| | | | | 361/2 |
| 2015/0229121 A1* | 8/2015 | Davidson | ............... | H02H 3/087 |
| | | | | 361/54 |
| 2019/0006835 A1* | 1/2019 | Inam | ...................... | H02H 9/041 |

OTHER PUBLICATIONS

The International Search Report and the Written Opinion for the International Patent Application No. PCT/US2019/66905 dated Mar. 3, 2020. (8 pages).

* cited by examiner

TRIGGERED VACUUM GAP FAULT DETECTION METHODS AND DEVICES

CROSS-REFERENCE TO RELATED APPLICATION

This application claims the benefit of the filing date of U.S. Provisional Application No. 62/718,139, filed Dec. 18, 2018, and titled Triggered Vacuum Gap Fault Detection Methods And Devices.

BACKGROUND

Field

This disclosure relates generally to a fault detection device including a vacuum gap switching element and, more particularly, to a fault detection device including a plurality of vacuum gap switching elements, where the fault detection device causes breakdown of the vacuum gap switching elements in response to a certain measured voltage angle to provide pulse testing for detecting fault current.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be provided on high voltage transmission lines that deliver electrical power to a number of substations typically located within a community, where the voltage is stepped down to a medium voltage. The substations provide the medium voltage power to a number of three-phase feeder lines. The feeder lines are coupled to a number of lateral lines that provide the medium voltage to various distribution transformers, where the voltage is stepped down to a low voltage and is provided to a number of loads, such as homes, businesses, etc.

Periodically, faults occur in the distribution network as a result of various things, such as animals touching the lines, lightning strikes, tree branches falling on the lines, vehicle collisions with utility poles, etc. Faults may create a short-circuit that increases the load on the network, which may cause the current flow from the substation to significantly increase, for example, many times above the normal current, along the fault path. This amount of current causes the electrical lines to significantly heat up and possibly melt, and also could cause mechanical damage to various components in the substation and in the network. Many times the fault will be a temporary or intermittent fault as opposed to a permanent or bolted fault, where the thing that caused the fault is removed a short time after the fault occurs, for example, a lightning strike, where the distribution network will almost immediately begin operating normally. Thus, these types of low impedance faults in transmission and distribution systems that may result in outages or equipment damage are a significant concern for electric power utilities because of high fault currents flowing during such faults.

Fault interrupters, such as reclosers, are provided on utility poles and in underground circuits along a power line and have a switch to allow or prevent current flow downstream of the recloser. These reclosers detect the current and voltage on the feeder to monitor current flow and look for problems with the network circuit, such as detecting a fault. If fault current is detected the recloser is opened in response thereto, and then after a short delay is closed in a process for determining whether the fault is still present. If fault current flows when the recloser is closed, it is immediately opened. If the fault current is detected again or two more times during subsequent opening and closing operations, then the recloser remains open, where the time between tests may increase after each test. Thus, if a fault persists, reclosing contributes to system reliability issues by re-exposing the system to the fault current, potentially multiple times before the recloser locks out and prevents any further current flow. This can subject power transformers and other current carrying equipment to excess current, which, in turn, may result in mechanical stresses that increase wear, cause damage and decrease longevity of the equipment.

Reclosers are known that use pulse testing technologies where the closing and then opening of contacts is performed in a pulsed manner, where the pulses are typically less than one-half of a current cycle, so that the full fault current is not applied to the network while the recloser is testing to determine if the fault is still present. Pulse closing technologies have been successful in significantly reducing fault current stresses on network equipment during recloser testing. However, the switching devices required to generate these short pulse durations are relatively complicated and expensive. For example, vacuum interrupters employed to generate these pulses often use two magnetic actuators, one to close the contacts and one to quickly open the contacts using the moving mass of the opening actuator to reverse the direction of the closing actuator, well understood by those skilled in the art.

While various fault interruption devices and reclosing techniques based on mechanical switches exist for lower level distribution systems, they often do not scale to higher voltage transmission systems due to the mechanical stress resulting from those higher voltages and currents, which undesirably requires larger and more costly components. Additionally, the use of larger mechanical components may also pose synchronization issues or result in other problems due to the increased amount of time and energy required to activate such larger components. Accordingly, it is desirable to provide improved fault detection devices and reclosing schemes suitable for use with higher voltage transmission applications. Furthermore, other desirable features and characteristics of the present disclosure will become apparent from the subsequent detailed description and the appended claims, taken in conjunction with the accompanying drawings and the foregoing technical field and background.

SUMMARY

This disclosure discusses and describes a fault detection device including vacuum gap switching arrangements for use in electrical transmission systems and related operating methods are provided. An exemplary method of testing for a fault condition using a vacuum gap switching arrangement includes monitoring a voltage across the vacuum gap switching arrangement, triggering breakdown of the vacuum gap switching arrangement in response to an angle of the voltage corresponding to a desired switching angle to enable a temporary current flow through the vacuum gap switching arrangement, and verifying the absence or presence of a fault condition based at least in part on the temporary current flow. In the absence of a fault condition, an indication to close is provided to a parallel fault protection device.

In another embodiment, an apparatus for the fault detection device is provided. The fault detection device includes an interface, a voltage sensing arrangement coupled to the interface to measure a voltage at the interface, a current sensing arrangement coupled to the interface to obtain a measurement of a temporary current flow at the interface, a vacuum gap switching arrangement coupled to the interface, and a control module coupled to the voltage sensing arrangement, the current sensing arrangement, and the vacuum gap switching arrangement to trigger breakdown of the vacuum gap switching arrangement based on an angle of the voltage at the interface to enable the temporary current flow through the vacuum gap switching arrangement and verify absence of a fault condition based at least in part on the measurement of the temporary current flow.

In yet another embodiment, an electrical system is provided that includes a fault protection device coupled in series between a first electrical grid portion and a second electrical grid portion, and a fault detection device coupled between the first electrical grid portion and the second electrical grid portion, where the fault detection device is configured electrically parallel to the fault protection device, and where the fault detection device is configured to trigger breakdown of a vacuum gap switching arrangement of the fault detection device to enable a temporary current flow between the first electrical grid portion and the second electrical grid portion while the fault protection device is open, verify the absence of a fault condition based at least in part on the temporary current flow, and provide an indication to the fault protection device to close in the absence of the fault condition.

Additional features of the disclosure will become apparent from the following description and appended claims, taken in conjunction with the accompanying drawings.

BRIEF DESCRIPTION OF THE DRAWINGS

Embodiments of the subject matter will hereinafter be described in conjunction with the following drawing figures, where like numerals denote like elements, and where.

DETAILED DESCRIPTION

The following discussion of the embodiments of the disclosure directed to a fault detection device including a vacuum gap switching element is merely exemplary in nature and is in no way intended to limit the disclosure or its applications or uses.

Embodiments of the subject matter described herein relate to operating fault detection devices in an electrical energy transmission system to mitigate the impact of fault conditions when closing (or reclosing) a fault protection device. As described in greater detail below, in exemplary embodiments, a fault detection device is configured electrically parallel to a primary fault protection device to test for the presence of a fault condition prior to closing a switching element of the fault protection device. The fault detection device utilizes one or more triggered vacuum gap switching elements that are triggered or otherwise activated to allow a temporary current flow through the fault detection device, which may be analyzed, either independently or in concert with the voltage signal(s) measured at the fault detection device, to determine whether a fault condition exists. In this regard, triggering breakdown of the triggered vacuum gap switching elements allows a temporary current flow similar to pulsed closing of a mechanical or semiconductor switching element for a limited period of time, with the vacuum gap switching elements interrupting current flow at the first current zero. The limited duration of the temporary current flow also limits the potential exposure of transformers and other components to any fault current, thereby mitigating stress during fault testing. After effectively pulse closing the triggered vacuum gap switching elements and verifying or otherwise confirming the absence of a fault condition, the fault detection device signals the primary fault protection device to close its switching element or otherwise enable current flow.

Figure 1:
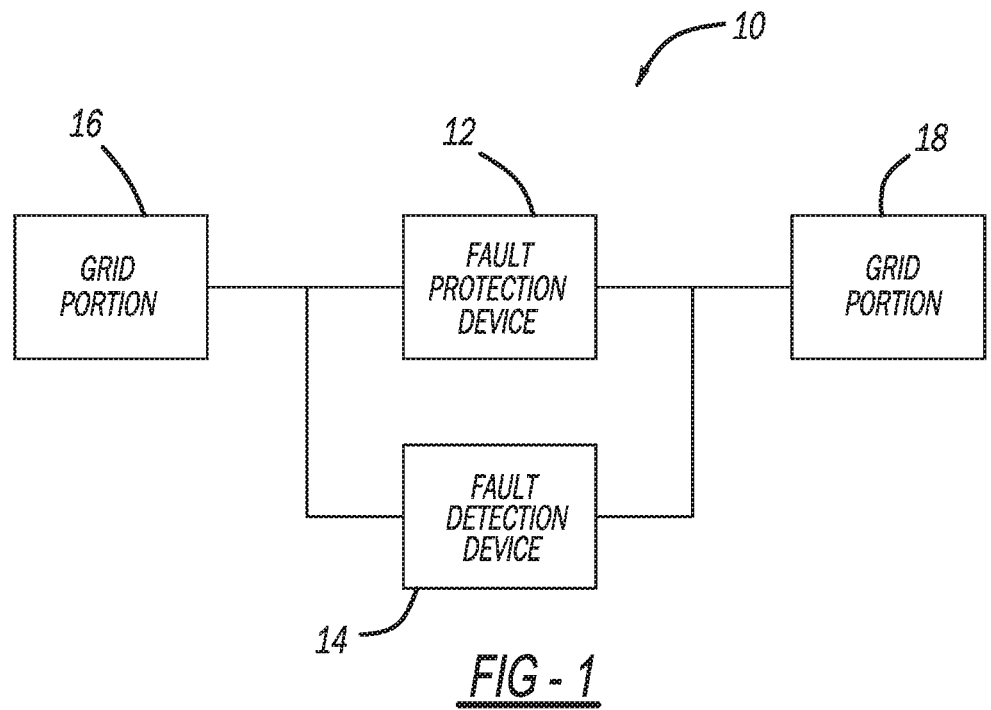
FIG. 1 is a block diagram of an electrical system for one or more exemplary embodiments.

FIG. 1 depicts an exemplary embodiment of an electrical system 10 that includes, without limitation, a fault protection device 12 capable of selectively isolating different grid portions 16 and 18 of an electrical grid from an adjacent or interconnecting portion of the grid in response to a fault condition or other anomaly detected by a fault detection device 14. The fault detection device 14 is configured electrically parallel to the fault protection device 12 between the grid portions 16 and 18. While described as a separate device in parallel with the fault protection device 12, the fault detection device 14 may be incorporated into a common housing or housing or otherwise joined as a completed assembly with the fault protection device 12.

The grid portions 16 and 18 of the electrical grid generally represent the transmission lines, distribution lines, transformers, and/or other electrical components that provide an electrical interconnection to enable current flow between the grid portions 16 and 18 of the electrical grid. By way of example, in one embodiment, the grid portion 16 may be coupled to one or more components configured to generate or otherwise supply electrical power, while the grid portion 18 may be coupled to one or more devices, systems, components, or loads that receive or consume electrical power from the electrical grid. It should be understood that FIG. 1 is a simplified representation of the electrical system 10 for purposes of explanation and is not intended to be limiting. For example, in practice, the electrical grid portions 16 and 18 may be realized or implemented as three-phase electric systems with corresponding wiring, lines and other electrical components to support three-phase operation. Thus, although the various elements, connecting lines or the like may be depicted in FIG. 1 in a single-phase form, or one-line diagram form, practical embodiments of the electrical system 10 may include such elements in multiple phases, commonly three phases, as will be appreciated in the art.

In one or more exemplary embodiments, the grid portion 16 is coupled to an upstream source of alternating current (AC) electrical energy at a transmission voltage level, such as an electric power generator, a step-up transformer, and/or the like, and the grid portion 18 is coupled to one or more electrical substations, step-down transformers, or the like that transform or otherwise convert the electrical energy from the transmission voltage level down to a level suitable for distribution and/or consumption by further downstream components, with the grid portions 16 and 18 representing the transmission lines and/or other intervening transmission components. That being said, it should be appreciated that the subject matter described herein is not intended to be limited to any particular type, number, arrangement, or configuration of upstream electrical power source(s) and/or downstream load(s) that are capable of being isolated or otherwise protected by the fault protection device 12.

In exemplary embodiments, the fault protection device 12 is a circuit breaker or similar overcurrent or impedance protection device that is configured electrically in series between the grid portions 16 and 18 of the electrical grid to protect upstream components (e.g., one or more power transformers) from potentially damaging fault currents caused by a low impedance fault downstream of the fault protection device 12. In this regard, the fault protection device 12 is configured to automatically prevent current flow between the grid portions 16 and 18 of the electrical grid interconnected by the fault protection device 12 in response to detecting a fault condition or other anomalous condition with respect to the current flow through the fault protection device 12. The fault protection device 12 generally includes, without limitation, a switching element (not shown) configured electrically in series between two input/output (I/O) interfaces of the fault protection device 12 connected to the respective grid portions 16 and 18, one or more sensing arrangements configured to measure a current and/or voltage at one or more of the I/O interfaces, and a control module coupled to the sensing arrangements and an actuation arrangement for the switching element. In response to a measured current and/or voltage indicative of a fault condition (e.g., a current that exceeds a fault detection threshold), the control module operates the actuation arrangement to open the switching element and disable current flow between the I/O interfaces through the fault protection device 12, and thereby effectively isolate the grid portions 16 and 18 from one another. In this regard, the switching element of the fault protection device 12 may include an electrical contact that is movable or otherwise actuatable by the actuation arrangement relative to another electrical contact to selectively enable or disable current flow through the electrical contacts. That being said, the subject matter described herein is not limited to any particular type of switching element used in the fault protection device 12.

As described in greater detail below, in exemplary embodiments, after the fault protection device 12 acts to prevent current flow in response to initially detecting a fault condition, the fault protection device 12 subsequently attempts to re-enable current flow (or reclose) after receiving an indication from the fault detection device 14 that the fault condition does not exist or has been cleared. In this regard, while the fault protection device 12 is open or otherwise preventing current flow between the grid portions 16 and 18, the fault detection device 14 is operated to allow a temporary current flow between the grid portions 16 and 18 to test for existence of a fault condition. The fault detection device 14 analyzes the temporary current flow to detect or otherwise identify whether a fault condition exists on or within one of the grid portions 16 and 18. When the fault detection device 14 verifies or otherwise confirms the absence of a fault condition, the fault detection device 14 provides a signal or other indication to the fault protection device 12 that notifies the fault protection device 12 that its switching element can be closed. For example, a control module of the fault detection device 14 may be coupled to a corresponding control module of the fault protection device 12 to command, signal, or otherwise instruct a control module associated with the fault protection device 12 to initiate closing of its switching element. In response, the control module associated of the fault protection device 12 may command, signal, instruct, or otherwise operate its actuation arrangement to cause the electrical contacts of the switching element to physically reengage or otherwise provide a path for current flow between the two contacts, and thereby enable current flow through the fault protection device 12. It will be appreciated further that the fault detection device 14 control module and the fault protection device 12 control module may be incorporated into a single control module configured in operative communication with each of the fault detection device 14 and fault protection device 12.

Figure 2:
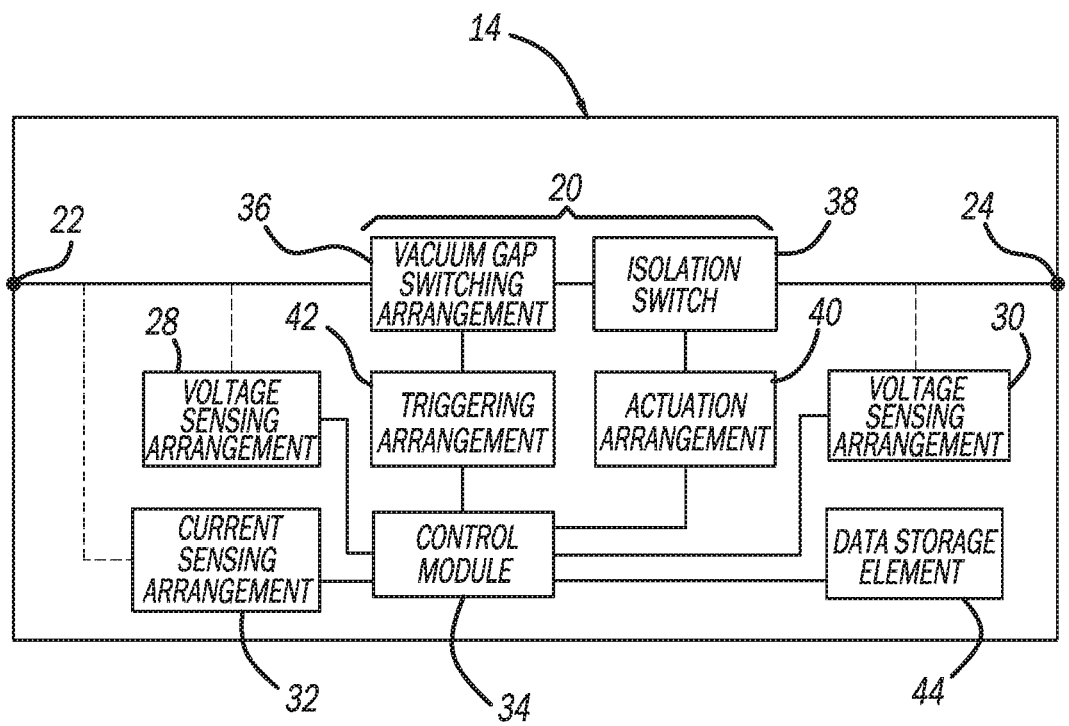
FIG. 2 is a block diagram of a fault detection device suitable for use in the electrical system of FIG. 1 in accordance with one or more exemplary embodiments.

FIG. 2 depicts an exemplary embodiment of the fault detection device 14 in the electrical system 10 of FIG. 1. The fault detection device 14 includes, without limitation, a switching arrangement 20 configured electrically in series between an upstream input/output (I/O) interface 22 and a downstream I/O interface 24 of the fault detection device 14, voltage sensing arrangements 28 and 30 coupled to the respective I/O interfaces 22 and 24, a current sensing arrangement 32 configured to measure a current flow between the I/O interfaces 22 and 24, and a control module 34. It should be understood that FIG. 2 is a simplified representation of the fault detection device 14 for purposes of explanation and is not intended to be limiting. In this regard, practical embodiments of the fault detection device 14 may include any number of sensing arrangements configured to measure electrical characteristics at or across any number of different locations of the fault detection device 14.

The switching arrangement 20 includes a vacuum gap switching arrangement 36 and may include an isolation switch 38 configured electrically in series with the vacuum gap switching arrangement 36, as described in greater detail below. The control module 34 is coupled to an actuation arrangement 40 for the isolation switch 38 and a triggering arrangement 42 for the vacuum gap switching arrangement 36, and the control module 34 operates the respective arrangements 40 and 42 to enable a temporary current flow through the switching arrangement 20 between the I/O interfaces 22 and 24. The control module 34 is coupled to the sensing arrangements 28, 30 and 32 and detects or otherwise identifies a potential fault condition based on the temporary current flow and/or its relationship to the measured voltage(s) associated with the I/O interfaces 22 and 24 of the fault detection device 14. In the absence of a fault condition, the control module 34 commands, signals, or otherwise notifies a control module associated with the fault protection device 12 that it is safe to reclose or otherwise re-enable current flow. Additionally, in exemplary embodiments, the control module 34 commands, instructs, signals, or otherwise operates the actuation arrangement 40 to maintain the switch 38 in an opened state to prevent current flow between the I/O interfaces 22 and 24.

The I/O interfaces 22 and 24 generally represent the respective terminals, connectors, taps, or other physical interface to the fault detection device 14 that supports establishing a conductive electrical connection with the wiring or other corresponding interface to the portion of the electrical grid adjacent to the fault detection device 14. For purposes of explanation and without limitation, the I/O interface 22 may alternatively be referred to herein as the input interface or upstream interface and the I/O interface 24 may alternatively be referred to herein as the output interface or downstream interface. That being said, it should be appreciated that the fault detection device 14 is not unidirectional in operation and may be employed in various different configurations where the I/O interface 24 could be effectively upstream of the I/O interface 22 or neither the I/O interface 22 or 24 is upstream of the other (e.g., where an electrical power source is present on each side of the fault detection device 14, the relevant portions of the electrical grid has a ring-like configuration, etc.).

In the illustrated embodiment, the voltage sensing arrangement 28 is coupled to the upstream interface 22 to measure the voltage at the upstream interface 22, and the voltage sensing arrangement 30 is coupled to the downstream interface 24 to measure the voltage at the downstream interface 24. In exemplary embodiments, the voltage sensing arrangements 28 and 30 are coupled capacitive voltage sensors; however, it should be appreciated that the subject matter described herein is not limited to any particular type of voltage sensing arrangement or voltage sensing technique. In one or more exemplary embodiments, the current sensing arrangement 32 includes one or more current transformers or other current sensors sensing current between the interfaces 22 or 24 and configured to provide a signal proportional to the current flow between the interfaces 22 and 24 and suitable for measuring by the control module 34.

In exemplary embodiments, the isolation switch 38 can be an air-insulated or gas-insulated isolation switch that is opened or closed when there is no current through its contacts and is actuated by the actuation arrangement 40. In an open state, the isolation switch 38 increases the voltage that the vacuum gap switching arrangement 36 is able to withstand without inadvertently allowing current flow through the fault detection device 14 between the interfaces 22 and 24. In a closed state, the isolation switch 38 allows current to flow between the interfaces 22 and 24 through the fault detection device 14 if the vacuum gap switching arrangement 36 is triggered. That being said, the subject matter described herein is not limited to any particular type for the isolation switch 38. In one or more exemplary embodiments, the actuation arrangement 40 is operable by the control module 34 to displace a movable electrical contact of the isolation switch 38 from one extent of its range of motion to another extent of its range of motion. For example, to close the isolation switch 38 and enable current flow, the control module 34 may provide a signal to the actuation arrangement 40 to force or otherwise displace the movable electrical contact of the isolation switch 38 into physical contact with the other electrical contact to enable current flow through the electrical contacts. Conversely, to open the isolation switch 38 and disable current flow, another signal may be provided to the actuation arrangement 40 to displace the movable electrical contact away from the fixed electrical contact to disable current flow. That being said, the subject matter described herein is not limited to any particular type of the actuation arrangement 40 or the isolating switch 38.

Depending on the embodiment, the control module 34 may be implemented or realized with a processor, a controller, a microprocessor, a microcontroller, a content addressable memory, a digital signal processor, an application specific integrated circuit, a field programmable gate array, any suitable programmable logic device, discrete gate or transistor logic, processing core, discrete hardware components, or any combination thereof, and configured to carry out the functions, techniques, and processing tasks associated with the operation of the fault detection device 14 described in greater detail below. Furthermore, the steps of a method or algorithm described in connection with the embodiments disclosed herein may be embodied directly in hardware, in firmware, in a software module executed by the control module 34, or in any practical combination thereof. In accordance with one or more embodiments, the control module 34 includes or otherwise accesses a data storage element 44, which may be realized as any sort of memory (e.g., RAM memory, ROM memory, flash memory, registers, a hard disk, or the like) or other suitable non-transitory short or long term storage media capable of storing computer-executable programming instructions or other data for execution that, when read and executed by the control module 34, cause the control module 34 to execute, facilitate, or perform one or more of the processes, tasks, operations, and/or functions described herein.

In exemplary embodiments, the data storage element 44 stores or otherwise maintains values or data that characterize or otherwise define the different fault detection thresholds to be implemented by the fault detection device 14 along with values or data that characterize or otherwise define the different time periods that are utilized by the fault detection device 14 for purposes of automatically reclosing the isolation switch 38, as described in greater detail below. In some embodiments, the various fault detection thresholds, time periods, and other testing or reclosing criteria to be utilized by the fault detection device 14 may be user-configurable or otherwise modifiable by a user. For example, in embodiments where the fault detection device 14 is coupled to a communications network, a remote device may be utilized by a user to configure and upload fault detection and reclosing criteria to the control module 34 for storage in the data storage element 44 via the communications network. In other embodiments, a user interface device may be coupled to the fault detection device 14 and/or the control module 34 to support user modifications to the fault detection and/or reclosing criteria maintained in the data storage element 44.

Still referring to FIG. 2, in exemplary embodiments, the vacuum gap switching arrangement 36 includes one or more triggered vacuum gap switching elements configured electrically in series with one another to achieve a desired breakdown voltage level, as described in greater detail below in the context of FIG. 3. The triggering arrangement 42 is configured to synchronously or concurrently trigger breakdown of all the vacuum gaps of the vacuum gap switching arrangement 36 to simultaneously enable current flow through the vacuum gap switching arrangement 36. As described in greater detail below, the vacuum gap switching arrangement 36 automatically acts to prevent continuous current flow upon the resulting minor loop current reaching zero, and thus, the resulting current flow through the vacuum gap switching arrangement 36 is temporary and of limited duration.

Figure 3:
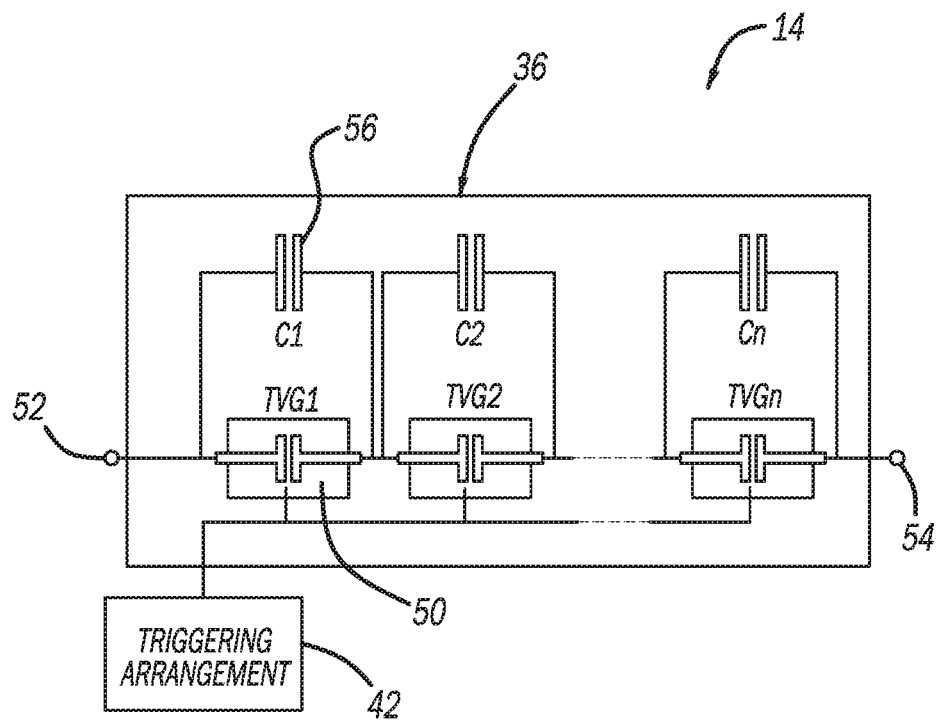
FIG. 3 is a schematic view of a switching arrangement with triggered vacuum gap switching elements suitable for use in the fault detection device of FIG. 2 in accordance with one or more exemplary embodiments.

FIG. 3 is schematic diagram of a portion of the fault detection device 14 showing details of the vacuum gap switching arrangement 36. The switching arrangement 36 includes a number of triggered vacuum gap switching elements 50 (TVG1, TVG2, . . . , TVGn) configured electrically in series with one another between I/O nodes 52 and 54 to withstand a desired cumulative voltage level for the vacuum gap switching arrangement 36. A capacitive element 56 is provided in parallel with each triggered vacuum gap switching element 50 that have substantially equal capacitances configured to evenly distribute the voltage differential between the I/O nodes 52 and 54 among the triggered vacuum gap switching elements 50. In one or more embodiments, the capacitance of the capacitive elements 56 is greater than 200 picofarads (pF). The triggering arrangement 42 is coupled to each of the triggered vacuum gap switching elements 50 and is configured to trigger breakdown of the vacuum gaps substantially simultaneously to initiate current flow between the I/O nodes 52 and 54 through the vacuum gap switching elements 50. It should be noted that in some embodiments the triggering arrangement 42 may not be coupled to all the vacuum gap switching elements 50. In such embodiments, a subset of the vacuum gap switching elements 50 may be allowed to breakdown (based on their respective gap lengths) as the voltage across the gaps increases in response to the triggered breakdown of other vacuum gap switching elements 50.

Figure 4:
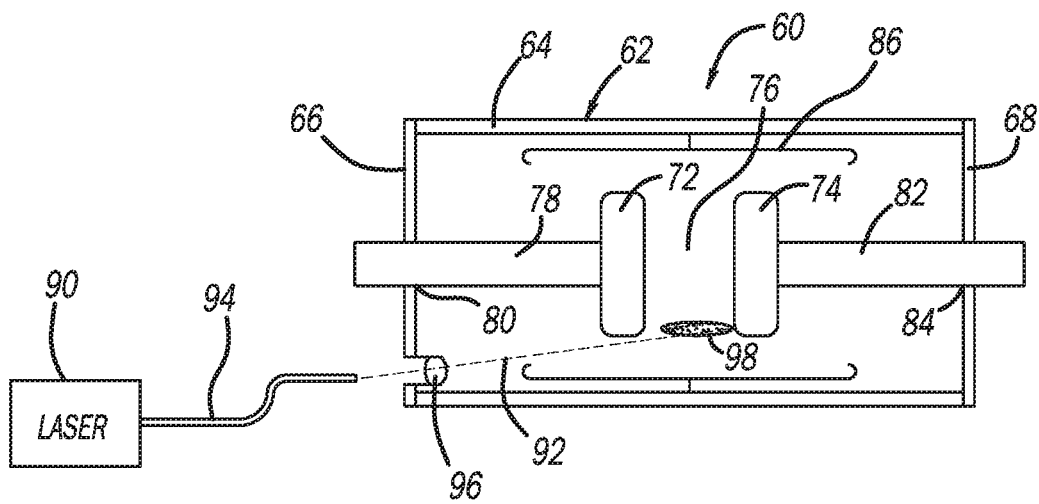
FIG. 4 is a plan view of an exemplary embodiment of a laser-triggered vacuum gap switching element suitable for use in a vacuum gap switching arrangement in the fault detection device of FIG. 2 in accordance with one or more exemplary embodiments.

FIG. 4 is a cross-sectional type view of an exemplary embodiment of a laser-triggered vacuum gap switching element 60 suitable for use as the triggered vacuum gap switching elements 50 in the vacuum gap switching arrangement 36. The switching element 60 includes a vacuum enclosure 62 having a cylindrical insulator 64 and conductive end plates 66 and 68. In exemplary embodiments, the vacuum enclosure 62 is sealed at vacuum pressure of at least $10^{-6}$ mbar and less than $10^{-3}$ mbar. The laser-triggered gap switching element 60 also includes a pair of opposing conductive electrodes 72 and 74 defining a vacuum gap 76 therebetween. The electrode 72 is connected to a stem 78 that extends through a sealed hole 80 in the plate 66 and the electrode 74 is connected to a stem 82 that extends through a sealed hole 84 in the plate 68, where the stems 78 and 82 provide connection for the switching element 60 to other triggered vacuum gap switching elements and/or terminals in the vacuum gap switching arrangement 36. The internal surface of the insulator 64 is protected from conductive deposits by a cylindrical metallic vapor shield 86.

In this embodiment, the triggering arrangement 42 includes a laser 90 that produces a pulsed laser beam 92 propagating through an optical channel 94 that is introduced into the vacuum enclosure 62 through an optical viewport 96 in the plate 66 and onto the electrode 72. In one embodiment, the optical viewport 96 is made of silica glass, but other suitable optical materials can be used as well. The laser 90 produces the laser pulses in response to a signal or a command received from the control module 34 at a desired point within an electrical cycle of the voltage across the switching element 60. In exemplary embodiments, the duration of the laser pulse is within a range of about 0.5 nanoseconds to about 3 nanoseconds, and the energy level of the laser pulse is in the range of about 1 millijoule to about 100 millijoules. Geometrically, the laser pulse may be focused on a very small area on the electrode 72 so that the power density of the laser pulse on the electrode surface is magnified and the laser energy deposited into the electrode leads to almost instantaneous vaporization of electrode material and transition of vapor into a dense plasma cloud 98 that expands towards the electrode 74 as a plasma plume and leads to electrical breakdown of the gap 76 and creation of a electrical arc between the electrodes 72 and 74. Gap breakdown occurs based on the magnitude of the voltage differential between the electrodes 72 and 74 after the plasma plume is created. The electrode material may be chosen based on its triggering ability, i.e., its ablation ability under laser pulses, in conjunction with its vacuum arc interruption ability and dielectric strength in vacuum. In exemplary embodiments, the electrodes 72 and 74 are comprised of copper-chromium material but can alternatively be realized using any other suitable material for electrical contacts in vacuum.

Figure 5:
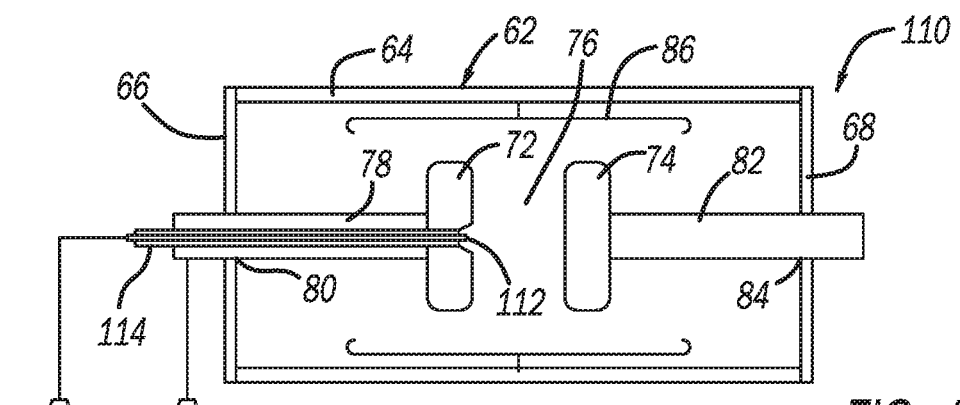
FIG. 5 is a plan view of an exemplary embodiment of a triggered vacuum gap switching element with electrical triggering suitable for use in a vacuum gap switching arrangement in the fault detection device of FIG. 2 in accordance with one or more exemplary embodiments.

FIG. 5 is a cross-sectional type view of another embodiment of a triggered vacuum gap switching element 110 suitable for use as the triggered vacuum gap switching element 50, where breakdown of the gap 76 is triggered electrically, and where like elements to the switching element 60 are identified by the same reference number. The switching element 110 includes a triggering electrode 112 that extends through a central bore in the stem 78 and the electrode 72, as shown, where a ceramic insulator 114 electrically insulates the triggering electrode 112 from the electrode 72 and its stem 78. The triggering electrode 112 is spaced apart from that electrode 72 by a smaller distance than the distance between the electrodes 72 and 74. In this embodiment, the triggering arrangement 42 is a high voltage impulse generating circuit 116 that is electrically connected to the triggering electrode 112 and the stem 78 so that it can apply a voltage between the triggering electrode 112 and the electrode 72. When the circuit 116 receives a signal or a command from the control module 34 (at a desired point within an electrical cycle of the voltage across the switching element 110), it provides a voltage impulse with a very fast rise time (e.g., less than 10 µs) and with a sufficiently high peak voltage (e.g., greater than 10 kV) between the triggering electrode 112 and the electrode 72. This causes breakdown of a triggering gap between the triggering electrode 112 and the electrode 72, which, in turn, creates a plasma cloud that propagates into the gap 76 between the electrodes 72 and 74, which leads to breakdown of the gap 76 substantially simultaneously (e.g., in 1 µs or less). Breakdown of the gap 76 is caused by the voltage differential between the electrodes 72 and 74 after the plasma cloud is created by breakdown of the triggering gap between the triggering electrode 112 and the electrode 72. After breakdown of the gap 76, an electrical arc is created between the electrodes 72 and 74 that conducts current across the gap 76 until the first current zero.

Figure 6:
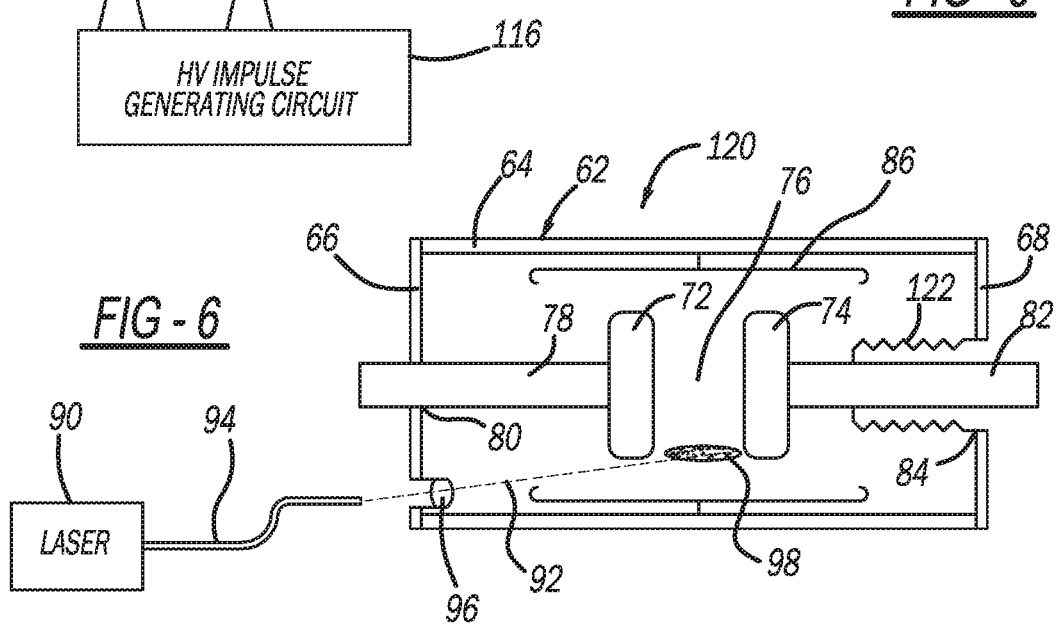
FIG. 6 is a plan view of an exemplary embodiment of a laser-triggered vacuum gap switching element having an adjustable electrode in accordance with one or more exemplary embodiments.

It should be noted that in some embodiments one of the electrodes 72 or 74 can be movable. FIG. 6 is a cross-sectional view of a triggered vacuum gap switching element 120 suitable for use as the triggered vacuum gap switching element 50 that illustrates an example of such an embodiment, where like elements to the switching element 60 are identified by the same reference number. In this embodiment, the stem 82 of the electrode 74 is attached to a bellows 122 that is secured to the plate 68, where the stem 82 would be connected to some type of an actuator (not shown) for moving the stem 82 axially without compromising the vacuum in the enclosure 62. Thus, the separation distance between the electrodes 72 and 74, i.e., the length of the gap 76, can be adjusted to tune the gap 76 and thereby achieve a desired breakdown voltage.

Figure 7:
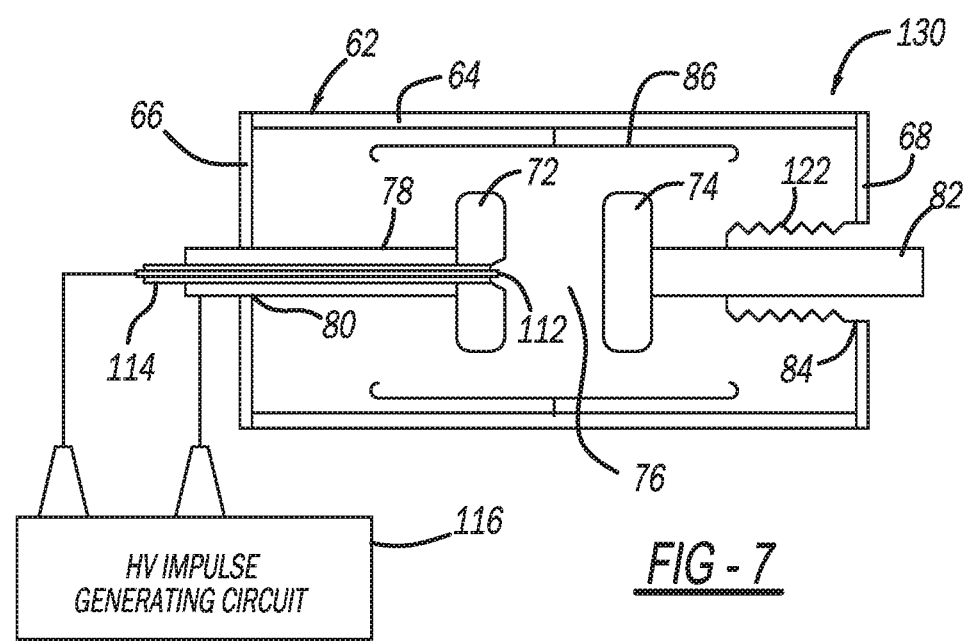
FIG. 7 is a plan view of an exemplary embodiment of a triggered vacuum gap switching element with electrical triggering and having an adjustable electrode in accordance with one or more exemplary embodiments.

FIG. 7 is a cross-sectional type view of a triggered vacuum gap switching element 130 suitable for use as the triggered vacuum gap switching element 50 that illustrates use of the bellows 122 for the embodiment shown in FIG. 5 for the electrode 74 that does not include the triggering electrode 112, where like elements to the switching elements 110 and 120 are identified by the same reference number.

Figure 8:
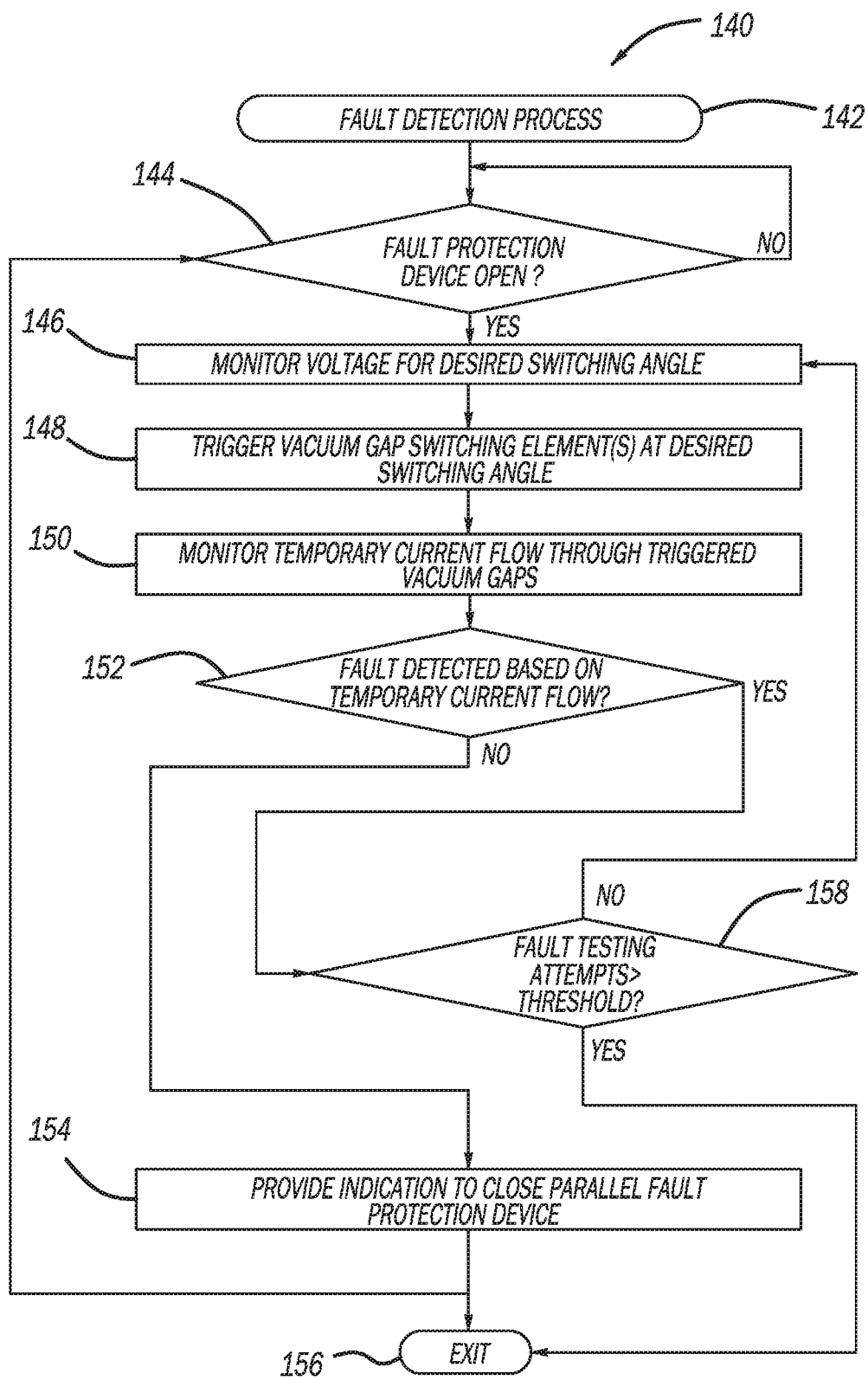
FIG. 8 is a flow chart of a fault detection process suitable for use with a fault detection device in the electrical system of FIG. 1 in one or more exemplary embodiments.

FIG. 8 is a flow chart diagram 140 illustrating an exemplary embodiment of a fault detection process suitable for implementation by the fault detection device 14 to test for the presence of faults or other anomalous conditions and initiate closing of the fault protection device 12 after verifying the absence of such conditions. The various tasks performed in connection with the illustrated process may be implemented using hardware, firmware, software executed by processing circuitry, or any combination thereof. For illustrative purposes, the following description may refer to elements mentioned above in connection with FIGS. 1-7. It should be appreciated that the fault detection process, as described, may include any number of additional or alternative tasks, the tasks need not be performed in the illustrated order and/or the tasks may be performed concurrently, and/or the fault detection process may be incorporated into a more comprehensive procedure or process having additional functionality not described in detail herein. Moreover, one or more of the tasks shown and described in the context of the diagram 140 could be omitted from a practical embodiment of the fault detection process as long as the intended overall functionality remains intact.

In exemplary embodiments, the fault detection process is initiated at box 142 and monitors the fault protection device 12 or measured electrical characteristics associated therewith for indication that the fault protection device 12 is open or otherwise preventing current flow at decision diamond 144. For example, the control module 34 may monitor the measured voltages at the I/O interfaces 22 and 24 to detect or otherwise identify a voltage differential between the electrical grid portions 16 and 18 that indicates that the switching element of the parallel fault protection device 12 is open or otherwise disabling current flow between the grid portions 16 and 18. In this regard, when the switching element of the fault protection device 12 is closed to allow current flow between the grid portions 16 and 18 the voltages of the respective electrical grid portions 16 and 18 should be substantially equal (plus or minus any voltage drop created by conduction current across the fault protection device 12). In other embodiments, a control module of the fault protection device 12 may generate an interrupt or otherwise provide a signal or indication to the control module 34 of the fault detection device 14 that indicates the state of the fault protection device 12.

In exemplary embodiments, if the fault protection device 12 is open at the decision diamond 144, the process tests for a fault condition at box 146 by monitoring or otherwise analyzing the electrical angle of the voltage across the vacuum gap switching arrangement 36 and triggers a substantially synchronous breakdown of the gap 76 at the desired switching angle to enable a temporary current flow through the fault detection device 14 using the vacuum gap switching arrangement 36 at box 148 using any of the switching elements discussed above. It should be noted that the switching angle at which breakdown of the vacuum gaps is triggered dictates the magnitude and duration of the resulting temporary current flow through the fault detection device 14, as described in greater detail below in the context of FIG. 9.

The fault detection process monitors or otherwise analyzes the temporary current flow though the fault detection device 14 using the current sensing arrangement 32 at box 150 and identifies or otherwise determines whether or not a fault condition exists based on the temporary current flow at decision diamond 152. It should be noted that there are numerous different techniques for analyzing current flow to detect presence of a fault condition, and the subject matter described herein is not intended to be limited to any particular fault detection threshold, scheme, or technique. For example, in one or more embodiments, a fault may be detected when the peak value of the current flow measured by the current sensing arrangement 32 exceeds a fault detection threshold. In other embodiments, a fault condition may be detected by analyzing the temporary current flow with respect to a time-current characteristic curve. As another example, impedance-based fault detection may be utilized to detect a fault condition based on the relationship between the measured voltage and the measured current flow (e.g., a measured impedance that is less than a fault detection threshold impedance). Power-based fault detection (e.g., the measured power is greater than a fault detection threshold value), frequency-based fault detection (e.g., the magnitude of the difference between the frequency of the measured current and a reference frequency value is greater than or less than a fault detection threshold), sensitive earth fault detection, neutral unbalance fault detection, sequence components, or another mathematical analysis technique may also be utilized to detect presence of a fault current.

In the absence of detecting a fault condition based on the temporary current flow, the fault detection process provides a command to reclose the fault protection device 102 at box 154. In this regard, when the fault detection device 14 verifies or otherwise confirms the absence of a fault condition on the grid portions 16 and 18, the control module 34 provides an indication that it is safe to reclose the switching element of the fault protection device 12. For example, the control module 34 may generate an interrupt or otherwise provide a signal to a corresponding control module of the fault protection device 12 to notify the fault protection device 12 that a temporary or intermittent fault condition that initially triggered opening of the fault protection device 12 no longer exists on the grid portions 16 and 18. In response to receiving the indication from the fault detection device 14, the fault protection device 12 may close its switching element to allow current flow between the grid portions 16 and 18 through the fault protection device 12. If the isolation switch 38 is present, the control module 34 also operates the actuation arrangement 40 in suitable sequence with the isolation switch 38 to enable/disable current flow through the fault detection device 14 as the case may be. The process then exits at box 156 or returns to the decision diamond 144 to monitor if the fault protection device 12 has been opened again.

If the fault detection process determines that a fault condition is present at the decision diamond 152, the process then determines whether the number of fault testing pulses by the fault detection device 14 has reached a maximum predetermined threshold at decision diamond 158, and if not returns to the box 146 for monitoring the voltage. If the number of fault testing attempts is greater than the threshold number of attempts at the decision diamond 158, then the fault protection device 12 is locked open at the fault detection process ends at the box 156. In this regard, the fault detection device 14 may perform multiple tests for a fault condition before entering a locked-out state where the fault protection device 12 is maintained in an open state. When the number of attempts is less than the lockout threshold, the loop repeats to verify whether or not the fault condition still persists. In some embodiments, a delay period may be enforced between successive testing attempts to allow for the fault condition to be cleared by other components or otherwise evolve or dissipate. In such embodiments, the control module 34 may initiate a delay timer in response to detecting a fault condition before repeating the fault testing. Once a threshold number of fault testing attempts have confirmed persistence of the fault condition, the fault detection process reopens the isolation switch 38 and maintains the fault protection device 12 in the open state. In this regard, in some embodiments, when the fault detection device 14 confirms a persistent fault condition, the control module 34 of the fault detection device 14 may generate an interrupt or otherwise provide a signal to the fault protection device 12 to notify the fault protection device 12 that a persistent fault condition exists to maintain the switching element of the fault protection device 12 in an open state.

Figure 9:
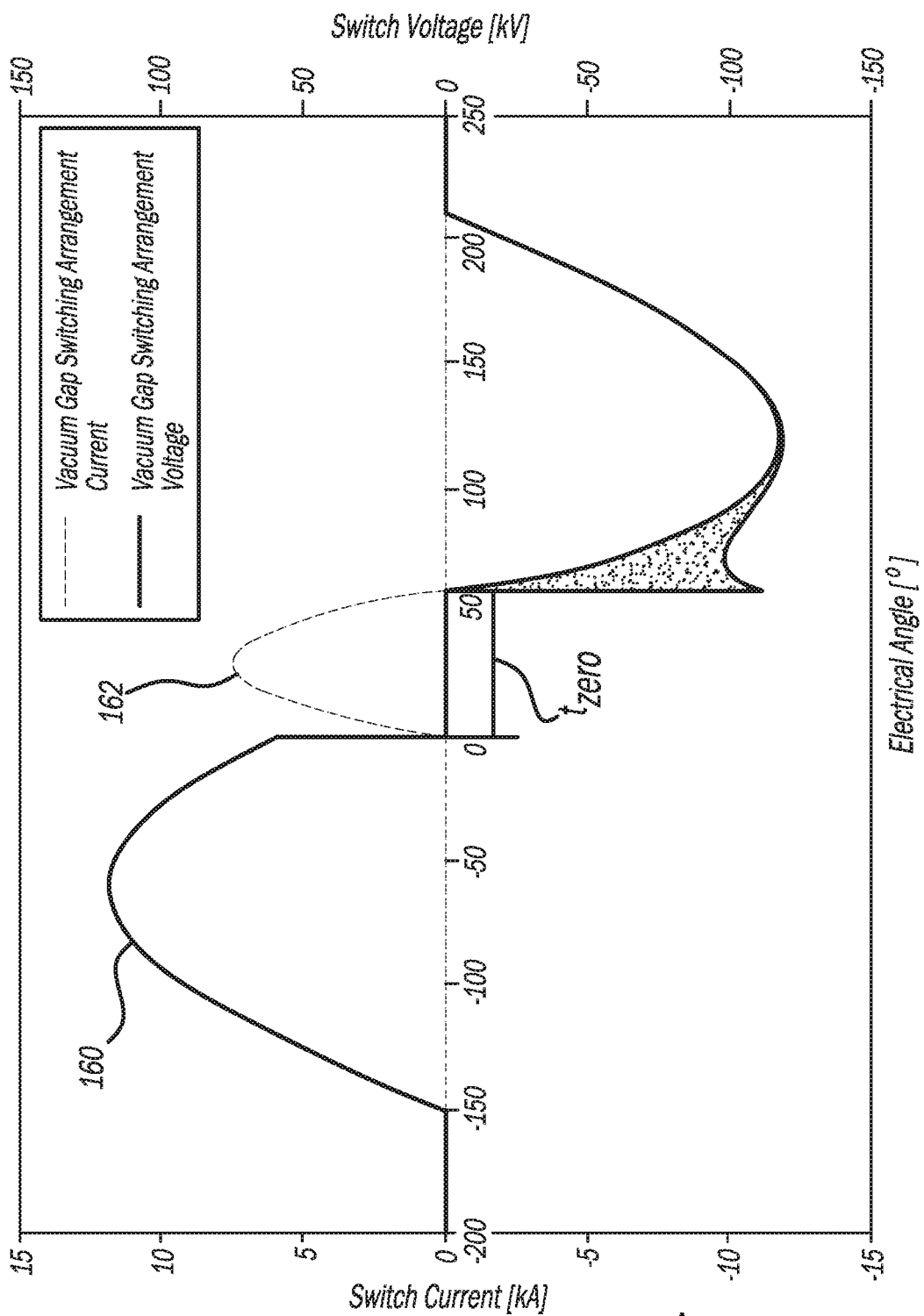
FIG. 9 is a graph of exemplary relationship between a voltage signal and a current flow through the fault detection device in conjunction with the fault detection process of FIG. 8 accordance with one or more exemplary embodiments.

FIG. 9 depicts a graph of the measured voltage 160 across the vacuum gap switching arrangement 36 and the measured current 162 through the vacuum gap switching arrangement 36 with respect to time for an exemplary embodiment. In this regard, FIG. 9 depicts an embodiment where the vacuum gap switching arrangement 36 is triggered at a switching angle of 150°. As illustrated, triggering breakdown of the vacuum gap switching arrangement 36 happens while a voltage difference exists across the vacuum gap switching arrangement and results in a minor loop current that lags the voltage. The current reaches zero at some time $t_{zero}$ after breakdown is triggered, at which point an electrical arc is interrupted between electrodes of each vacuum gap switching element of the vacuum gap switching arrangement 36, and thus, the vacuum gap switching arrangement 36 is effectively pulsed closed for the duration of time $t_{zero}$ required for the minor loop current to return to zero.

The switching angle for triggering breakdown of the vacuum gap switching arrangement 36 at a particular point on the voltage wave may be selected based on a number of different factors, such as, for example, the maximum amount of fault current that a system designer is willing to subject components to in the event of a persistent fault condition, the maximum amount of inrush current resulting from reenergizing a portion of the electrical grid, the minimum duration of time for which a system designer would like the temporary current to flow for purposes of the fault testing or detection scheme(s) being utilized, the voltage level at which the system designer would like to trigger breakdown to achieve a desired level of reliability or consistency with respect to the triggering, and the like. In this regard, increasing the switching angle decreases the duration and magnitude of the resultant current flow, while also reducing the voltage level at which the vacuum gap is to be broken down, which could decrease reliability, consistency, or repeatability of the triggering. On the other hand, decreasing the switching angle at which the breakdown of the vacuum gap switching arrangement is triggered increases current magnitude and the duration of time $t_{zero}$ during which a potential fault current could flow through the fault detection device 14 and thereby impact upstream and/or downstream components. For example, for a 60 Hz 145 kV system voltage and nominal symmetrical fault current of 40 kA and X/R of 20 typical for transmission systems, a switching angle of 150° results in a duration for the temporary current flow of $t_{zero}$=2.75 ms and a peak value for the current flow of 7.46 kA while a switching angle of 120° results in a duration for the temporary current flow of $t_{zero}$=5.45 ms and a peak value for the current flow of 27.38 kA. Continuing this example, a switching angle of 90° results in duration of current of 8.09 ms and peak current of 56.4 kA, thus, a switching angle of 150° achieves a reduction in the potential fault current exposure with respect to closing with switching angle of 90° (e.g., a peak current reduction of 86.2% and a current duration reduction by 66.0%). In addition, closing with higher angles gives substantially lower TRV after current interruption (e.g. TRV is 235 kV, 200 kV and 116 kV for switching angles of 90°, 120° and 150°, respectively). It should be noted that in some embodiments there may be a practical limit to which switching angle can be increased. For example, voltage across the vacuum gap switching arrangement 36 just before triggered breakdown is a sinusoidal function of switching angle, and if the switching angle is selected to be too close to 180°, voltage across the vacuum gap switching arrangement 36 may be too low at the triggering moment to achieve breakdown of the vacuum gaps. Accordingly, the switching angle may be selected to be the largest angle where the voltage level is sufficient to reliably support breakdown of the vacuum gap switching arrangement 36. For example, a switching angle of 165° with the fault conditions described above results in a voltage across the vacuum gap switching arrangement 36 of 30.4 kV at or around a time of triggering. If four series-configured vacuum gap switching elements are utilized, that results in a divided voltage of 7.6 kV per vacuum gap, which is sufficient for reliable synchronized triggering of all four vacuum gaps concurrently. Closing at this switching angle results in a peak current of 1.91 kA and minor loop current duration of 1.38 ms and achieves a 96.6% reduction in the potential fault current exposure relative to a switching angle of 90°. It will be appreciated therefore that a switching angle in the range from 90° to 180° maybe used, and for example a switching angle in the range from 120° to 165° may be used and for further example a switching angle in a range from 150° to 165° may be used based upon herein described condsiderations.

Referring again to FIG. 1 with reference to FIGS. 2-7, by way of example, in one embodiment, the fault detection device 14 detects or otherwise identifies when the fault protection device 12 trips open, and in response, closes its isolation switching element 38 and monitors the voltage difference between the I/O interfaces 22 and 24 to identify when a point (or sample) of the measured voltage difference corresponds to an electrical angle of 150° (or 165° or whatever the desired switching angle is). When the measured voltage reaches the switching angle of 150°, the triggering arrangement 42 of the fault detection device 14 is operated to trigger breakdown between the electrodes of the voltage gap switching element(s) and enable current flow through the vacuum gap switching arrangement 36. The triggered breakdown results in current flow through the vacuum gap switching arrangement 36 for the duration $t_{zero}$ until discharge stops upon the minor loop current reaching zero. The control module 34 of the fault detection device 14 obtains measurements of the temporary current flow from the current sensing arrangement 32 and analyzes the measured temporary current flow to verify or otherwise confirm whether or not a fault condition exists. When the measured temporary current flow does not indicate a fault condition (e.g., the measured temporary current flow is less than a fault detection threshold, etc.), the control module 34 confirms a fault condition does not currently exist and commands, signals, or otherwise instructs the fault protection device 12 to reclose while also opening the isolation switching element 38 to disable current flow through the fault detection device 14.

It will be appreciated that the subject matter described herein does not require the use of mechanical switches for pulse-based fault testing or detection. Here, it is noted that conventional mechanically-operated switches suitable for higher voltage levels (to the extent suitable switches exist for the desired high voltage level) often have larger contacts that cannot be operated quickly enough to achieve a desired synchronization with a particular point on the voltage wave and also to interrupt current at the first zero in the minor loop of the fault current. Conversely, the subject matter described herein can be scaled up to higher voltage levels using vacuum gap switches in series while still naturally interrupting current at the current zero of the minor current loop resulting from a triggered breakdown (which is effectively a pulsed closing). Because the triggered vacuum gaps do not rely on mechanical closing of contacts, there are no constraints on the contact size, which allows for higher fault ratings to be achieved more practically. Additionally, the triggering of multiple vacuum gaps can be synchronized (e.g., using a common control signal, split laser beam pulses, etc.) in a manner that inherently achieves relatively low jitter (e.g., ±10 microseconds (µs) or less) due to the nature of triggered vacuum gap breakdown.

For the sake of brevity, conventional techniques related to electrical energy generation and distribution, overcurrent protection, fault detection, time-current curves, impedance characteristics, electrical breakdown, vacuum gaps, switching, signaling, sensing, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The foregoing description may refer to elements or components or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the drawings may depict one exemplary arrangement of elements with direct electrical connections, additional intervening elements, devices, features, or components may be present in an embodiment of the depicted subject matter. In addition, certain terminology may also be used in the following description for the purpose of reference only, and thus are not intended to be limiting. For example, the terms "first," "second," and other such numerical terms referring to structures do not imply a sequence or order unless clearly indicated by the context.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any theory presented in the preceding background, brief summary, or the detailed description.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the subject matter in any way. Rather, the foregoing detailed description will provide those skilled in the art with a convenient road map for implementing an exemplary embodiment of the subject matter. It should be understood that various changes may be made in the function and arrangement of elements described in an exemplary embodiment without departing from the scope of the subject matter as set forth in the appended claims. Accordingly, details of the exemplary embodiments or other limitations described above should not be read into the claims absent a clear intention to the contrary.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for determining if a fault condition exists in an electrical network, the method comprising:
   interrupting by opening a fault protection device a flow of current through the fault protection device responsive to the fault condition within the electrical network to isolate a first grid portion from remaining grid portions of a plurality of grid portions of the electrical network;
   monitoring a voltage angle of a voltage waveform across a vacuum gap switching arrangement disposed in parallel to the fault protection device if the fault protection device has opened to interrupt the current flow, the vacuum gap switching arrangement including at least one vacuum gap switching element;
   triggering at a predetermined voltage angle a breakdown of a vacuum gap in the at least one vacuum gap switching element to induce a temporary current flow through the vacuum gap switching arrangement;
   measuring the induced temporary current flow through the vacuum gap switching arrangement to provide a measured current flow; and
   determining whether the fault condition exists based at least in part on the measured current flow and a measured impedance value based on a relationship between the voltage and the temporary current flow;
   verifying the absence of the fault condition when the measured impedance value is greater than a fault detection threshold; and
   reconnecting by closing the fault protection device the first grid portion to the remaining grid portions of the plurality of grid portions of the electrical network if the fault no longer exists.

2. The method of claim 1, wherein
   the predetermined voltage angle sets the time that the temporary current flow will flow through the vacuum gap switching arrangement.

3. The method of claim 2, wherein the predetermined voltage angle is in a range from 150° to 165°.

4. The method of claim 1, wherein the at least one vacuum gap switching element is a plurality of vacuum gap switching elements electrically coupled in series withing the vacuum gap switching arrangement, and wherein triggering a breakdown of the vacuum gap in the at least one vacuum gap switching element includes triggering a breakdown of a vacuum gap in all of the plurality vacuum gap switching elements.

5. The method of claim 1, wherein triggering a breakdown of the vacuum gap in the at least one vacuum gap switching element includes emitting electromagnetic radiation towards one or more electrodes in the at least one vacuum gap switching element.

6. The method of claim 5, wherein the electromagnetic radiation is a laser beam.

7. The method of claim 1, wherein triggering a breakdown of the vacuum gap in the at least one vacuum gap switching element includes applying a voltage to a triggering electrode in the at least one vacuum gap switching element.

8. The method of claim 1, further comprising determining a peak value for the voltage across the vacuum gap switching arrangement and configuring the vacuum gap switching arrangement to support the peak value.

9. The method of claim 8, further comprising operating an isolation switching element to enable current flow through the vacuum gap switching arrangement after configuring the vacuum gap switching arrangement to support the peak value.

10. The method of claim 8, wherein configuring the vacuum gap switching arrangement includes operating an actuation arrangement coupled to a first electrode in the at least one vacuum gap switching element to adjust a distance between the first electrode and a second electrode in the at least one vacuum gap switching element so as to change a length of the vacuum gap.

11. The method of claim 1,. wherein determining whether the fault condition exists includes verifying the absence of the fault condition when the measured temporary current flow does not violate a fault detection time-current characteristic curve.

12. An arrangement for determining existence of a fault condition in an electrical network, the fault arrangement comprising:
a fault protection device, the fault protection device including a switch operable in an open state to interrupt a flow of current to a first grid portion from remaining grid portion of a plurality of grid portions in the electrical network;
a vacuum gap switching arrangement coupled in parallel to the fault protection device, the vacuum gap switching arrangement including a vacuum gap switch;
a voltage sensor coupled to the electrical network, the voltage sensor being configured to measure a voltage angle on the network;
a current sensor coupled to the network, the current sensor being configured to measure current flow on the network; and
a control module coupled to the voltage sensor, the current sensor and the vacuum gap switching arrangement,
the control module configured to instruct the vacuum gap switching arrangement to trigger a breakdown across the vacuum gap switch when the voltage angle corresponds to a predetermined switching voltage angle so as to cause a temporary current flow through the vacuum gap switching arrangement,
said control module determining whether the fault condition exists based at least in part on a characteristic of the temporary current flow as measured by the current sensor a measured impedance value based on a relationship between the voltage and the temporary current flow, and an absence of the fault condition when the measured impedance value is greater than a fault detection threshold; and
switch of the fault protection device reconnect to a closed state to reestablish current flow to the fist grid portion to the remaining grid portion of the plurality of the grid portion of the electric network if the fault condition no longer exists.

13. The detection device of claim 12, wherein the one vacuum gap switch is a plurality of vacuum gap switches electrically coupled in series, and wherein the control module instructs the vacuum gap switches to breakdown all of the vacuum gap switches.

14. The detection device of claim 12, wherein the control module instructs the vacuum gap switching arrangement to trigger a breakdown across the vacuum gap switch by emitting electromagnetic radiation towards one or more electrodes in the vacuum gap switch.

15. The detection device of claim 14, wherein the electromagnetic radiation is a laser beam.

16. The detection device of claim 12, wherein the control module instructs the vacuum gap switching arrangement to trigger a breakdown across the vacuum gap by applying a voltage to a triggering electrode in the at least one vacuum gap switching element.

17. An electrical system comprising the arrangement of claim 12.

* * * * *